United States Patent
Cho et al.

(10) Patent No.: US 9,696,382 B2
(45) Date of Patent: Jul. 4, 2017

(54) METHOD AND APPARATUS FOR ESTIMATING MAXIMUM POWER OF BATTERY BY USING INTERNAL RESISTANCE OF THE BATTERY

(71) Applicant: LG CHEM, LTD., Seoul (KR)

(72) Inventors: Il Cho, Daejeon (KR); Do Youn Kim, Daejeon (KR); Do Yang Jung, Hwaseong-si (KR)

(73) Assignee: LG CHEM, LTD., Seoul (KR)

( * ) Notice: Subject to any disclaimer, the term of this patent is extended or adjusted under 35 U.S.C. 154(b) by 292 days.

(21) Appl. No.: 14/249,727

(22) Filed: Apr. 10, 2014

(65) Prior Publication Data

US 2014/0218041 A1    Aug. 7, 2014

Related U.S. Application Data

(63) Continuation of application No. 11/440,888, filed on May 25, 2006, now abandoned.

(30) Foreign Application Priority Data

May 27, 2005    (KR) .................... 10-2005-0044862

(51) Int. Cl.
*G01N 27/416* (2006.01)
*G01R 31/36* (2006.01)
*B60L 11/18* (2006.01)

(52) U.S. Cl.
CPC ...... *G01R 31/3606* (2013.01); *B60L 11/1861* (2013.01); *G01R 31/3662* (2013.01);
(Continued)

(58) Field of Classification Search
CPC   Y02E 60/12; G01R 31/3648; G01R 31/3606; G01R 31/3651; G01R 31/3662
(Continued)

(56) References Cited

U.S. PATENT DOCUMENTS 4,581,714 A  *  4/1986  Reid .................... G01N 21/274
                                                              702/104
4,678,998 A     7/1987  Muramatsu
(Continued)

FOREIGN PATENT DOCUMENTS

JP          1-239487 A     9/1989
JP          8-179018 A     7/1996
(Continued)

*Primary Examiner* — Richard Isla Rodas
*Assistant Examiner* — Johali Torres Ruiz
(74) *Attorney, Agent, or Firm* — Birch, Stewart, Kolasch & Birch, LLP

(57) ABSTRACT

Disclosed is a method for estimating the maximum power of a battery, which can inexpensively perform an estimation of the maximum power of a battery in a relatively simple manner of using the internal resistance of the battery, which has a correlation with and a largest effect on the maximum power of the battery. The method includes the steps of: measuring an internal resistance and a temperature of the battery and estimating a state of charge, if an estimation of the maximum power of the battery is requested; and reading a value of the maximum power of the battery, which corresponds to the measured temperature, the estimated state of charge, and the measured internal resistance, from a table in which the internal resistances and the maximum powers of the battery are mapped according to the temperatures and states of charge.

3 Claims, 3 Drawing Sheets

(52) U.S. Cl.
CPC ....... G01R 31/3675 (2013.01); *Y02T 10/7005* (2013.01); *Y02T 10/705* (2013.01); *Y02T 10/7044* (2013.01)

(58) Field of Classification Search
USPC .................................. 324/427, 430; 320/132
See application file for complete search history.

(56) References Cited

U.S. PATENT DOCUMENTS

| | | | |
|---|---|---|---|
| 5,281,919 A | | 1/1994 | Palanisamy |
| 5,453,851 A | * | 9/1995 | Faulhaber .............. H04N 1/053 358/296 |
| 6,788,069 B2 | * | 9/2004 | Vacher ................ B60L 11/1851 320/162 |
| 2004/0001559 A1 | * | 1/2004 | Pinckley .............. H03F 1/3223 375/297 |

FOREIGN PATENT DOCUMENTS

| | | |
|---|---|---|
| JP | 9-119964 A | 5/1997 |
| JP | 11-27874 A | 1/1999 |
| JP | 11-162526 A | 6/1999 |
| JP | 2001-33532 A | 2/2001 |
| JP | 2004-15866 A | 1/2004 |

\* cited by examiner

FIG. 1

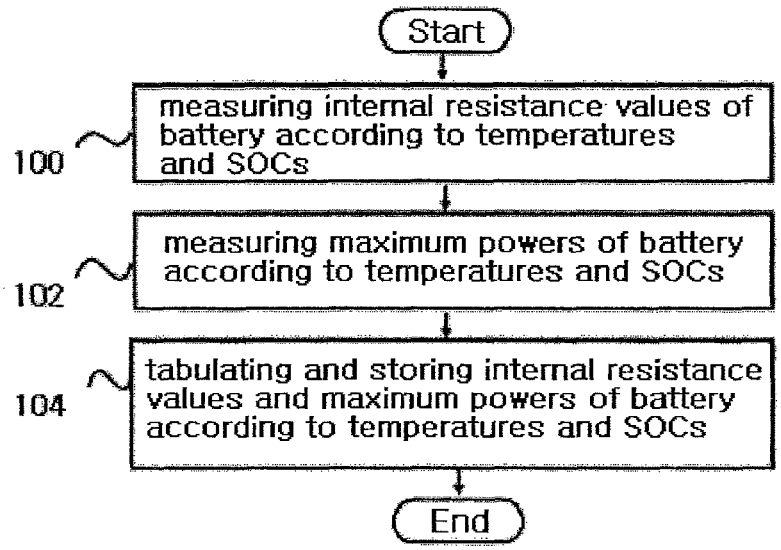

FIG. 2

| temperature | SOC | internal resistance of battery | maximum power of battery |
|---|---|---|---|
| first temperature | first SOC | value of first internal resistance | value of first maximum power |
| | second SOC | value of second internal resistance | value of second maximum power |
| | ... | ... | ... |
| | $N^{th}$ SOC | value of $N^{th}$ internal resistance | value of $N^{th}$ maximum power |
| second temperature | $(N+1)^{th}$ SOC | value of $(N+1)^{th}$ internal resistance | value of $(N+1)^{th}$ maximum power |
| | $(N+2)^{th}$ SOC | value of $(N+2)^{th}$ internal resistance | value of $(N+2)^{th}$ maximum power |
| | ... | ... | ... |
| | $(N+N)^{th}$ SOC | value of $(N+N)^{th}$ internal resistance | value of $(N+N)^{th}$ maximum power |
| ... | ... | ... | ... |
| $M^{th}$ temperature | $(M+1)^{th}$ SOC | value of $(M+1)^{th}$ internal resistance | value of $(M+1)^{th}$ maximum power |
| | $(M+2)^{th}$ SOC | value of $(M+2)^{th}$ internal resistance | value of $(M+2)^{th}$ maximum power |
| | ... | ... | ... |
| | $(M+N)^{th}$ SOC | value of $(M+N)^{th}$ internal resistance | value of $(M+M)^{th}$ maximum power |

METHOD AND APPARATUS FOR ESTIMATING MAXIMUM POWER OF BATTERY BY USING INTERNAL RESISTANCE OF THE BATTERY

This application is a Continuation of application Ser. No. 11/440,888, filed May 25, 2006, which claims the benefit of the filing date of Korean Patent Application No. 10-2005-0044862, filed on May 27, 2005, in the Korean Intellectual Property Office, the disclosure of which is incorporated herein in its entirety by reference.

BACKGROUND OF THE INVENTION

1. Field of the invention

The present invention relates to a method for estimating the maximum power of a battery for a Hybrid Electric Vehicle (HEV), more particularly to an apparatus and a method for estimating the current maximum power of the battery by using the internal resistance of the battery, one of various environment parameters, which has the greatest effect on the maximum power of the battery mounted on a vehicle.

2. Description of the Prior Art

Electric vehicles use electric energy stored in a battery as an energy source. Lithium-ion polymer batteries are mainly used as the batteries for the electric vehicles, and researches for the lithium-ion polymer batteries have been progressed.

The power and the like of the battery mounted on the electric vehicle are controlled according to various control information stored in a Battery Management System (BMS). It is known that the estimation and the notification of the maximum power of the current battery, among the functions of the BMS, configure the most important information in the hybrid electric vehicle.

However, as the maximum power of the battery is sensitively changed according to temperature, the state of charge (SOC), and the state of health (SOH), it cannot be measured directly. Since the maximum power of the battery has too intensive a nonlinearity, it is impossible to measure the maximum power of the battery directly. Thus, only a method for estimating the maximum power of the battery indirectly has been proposed.

Nevertheless, a conventional art just discloses the method for estimating the maximum power of the battery only using the above-mentioned parameters such as temperature, the state of charge, and the state of health. It does not disclose a method for estimating the maximum power of the battery using the internal resistance of the battery, which directly relate to the maximum power of the battery.

SUMMARY OF THE INVENTION

It is an object of the present invention to provide a method for estimating the maximum power of a battery, which can inexpensively perform the estimation the maximum power of a battery in the relatively simple manner of using the internal resistance of the battery which has a correlation with and the largest effect on the maximum power of the battery.

In order to accomplish the object of the present invention, there is provided a method of estimating a maximum power of a battery, which includes the steps of: measuring an internal resistance and a temperature of the battery and estimating its state of charge, if an estimation of the maximum power of the battery is requested; and reading a value of the maximum power of the battery, which corresponds to the measured temperature, the estimated state of charge, and the measured internal resistance, from a table in which the values of the internal resistance and the maximum power of the battery are mapped so as to correspond to each temperature and each state of charge.

The present invention can easily and accurately estimate the maximum power of the battery using the internal resistance of the battery as well as various parameters having an effect on the maximum power of the battery.

BRIEF DESCRIPTION OF THE DRAWINGS

FIG. 1 is a flowchart illustrating a method for configuring a table of the maximum power of a battery according to the preferred embodiment of the present invention.

FIG. 2 is a view showing a table of the maximum power of the battery according to the preferred embodiment of the present invention.

DETAILED DESCRIPTION OF THE PREFERRED EMBODIMENTS

Hereinafter, the preferred embodiment of the present invention will be described with reference to the accompanying drawings.

First, a method for configuring a table of the maximum power of a battery according to the present invention will be described with reference to FIG. 1.

An experimenter measures internal resistance values according to temperatures and states of charge (step 100). At this time, the environments, i.e. temperature and state of charge, under which the internal resistance value of the battery is measured, are within a range of an actually operational temperature and an actually operational state of charge of a certain battery. Specifically, with relation to the measurement of the internal resistance value, voltages and currents are preferably measured according to temperatures and states of charge, instead of directly measuring the internal resistance values, so that each of the internal resistance values is calculated by using the measured value of the voltage and the current.

Then, the experimenter experimentally measures the values of the maximum power of the battery according to temperatures and states of charge in the same manner of measuring the internal resistance values (step 102).

Next, the values obtained through the measurement at steps 100 and 102 are correlated with one another, and thereby a table for the maximum power of the battery which shows the correlation of the internal resistance value with the maximum power of the battery is constructed. Then, the table of the maximum power of the battery is stored in a memory of the battery management system provided with the corresponding battery (step 104). As shown in FIG. 2, internal resistance values and maximum powers of the battery, which correspond to respective temperatures and states of charge, are mapped in the table for the maximum power of the battery.

Hereinafter, the structure of an apparatus for estimating the value of the maximum power of the battery using the table for the maximum power of the battery will be described with respect to FIG. 3.

Figure 3:
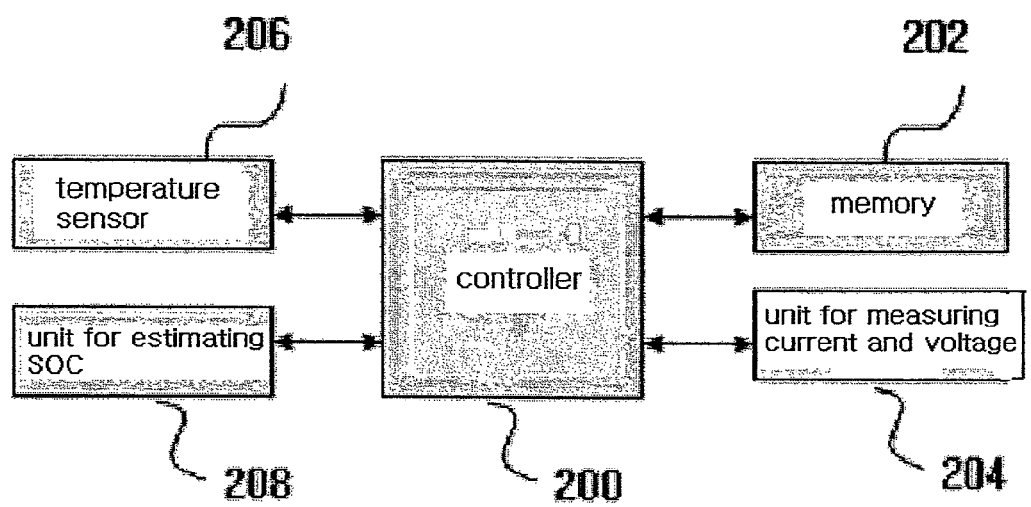
FIG. 3 is a block diagram showing the structure of an apparatus for estimating the maximum power of the battery according to the preferred embodiment of the present invention.

A controller 200 entirely controls units of FIG. 3, and performs processes for estimating the maximum power of the battery according to the preferred embodiment of the present invention. Specifically, after performing the measurement of temperature, estimation of the state of charge, and the calculation of the internal resistance value, the controller 200 reads the value of the maximum power, which corresponds to temperatures, the states of charge, and the internal resistance values obtained, from the table for the maximum power of the battery, so as to easily and rapidly estimate the value of the maximum power of the corresponding battery.

A memory 202 stores a variety of information as well as the processing program of the controller 200. Specifically, the table for the maximum power of the battery shown in FIG. 2 is stored in the memory, according to the preferred embodiment of the present invention.

A unit 204 for measuring the current and the voltage measures the current and the voltage of the battery in order to estimate the maximum power of the corresponding battery and provides the result to the controller 200.

A temperature sensor 206 measures the temperature, and provides the result to the controller 200.

A unit for estimating the state of charge 208 estimates the state of charge of the corresponding battery, and provides the result to the controller 200.

Figure 4:
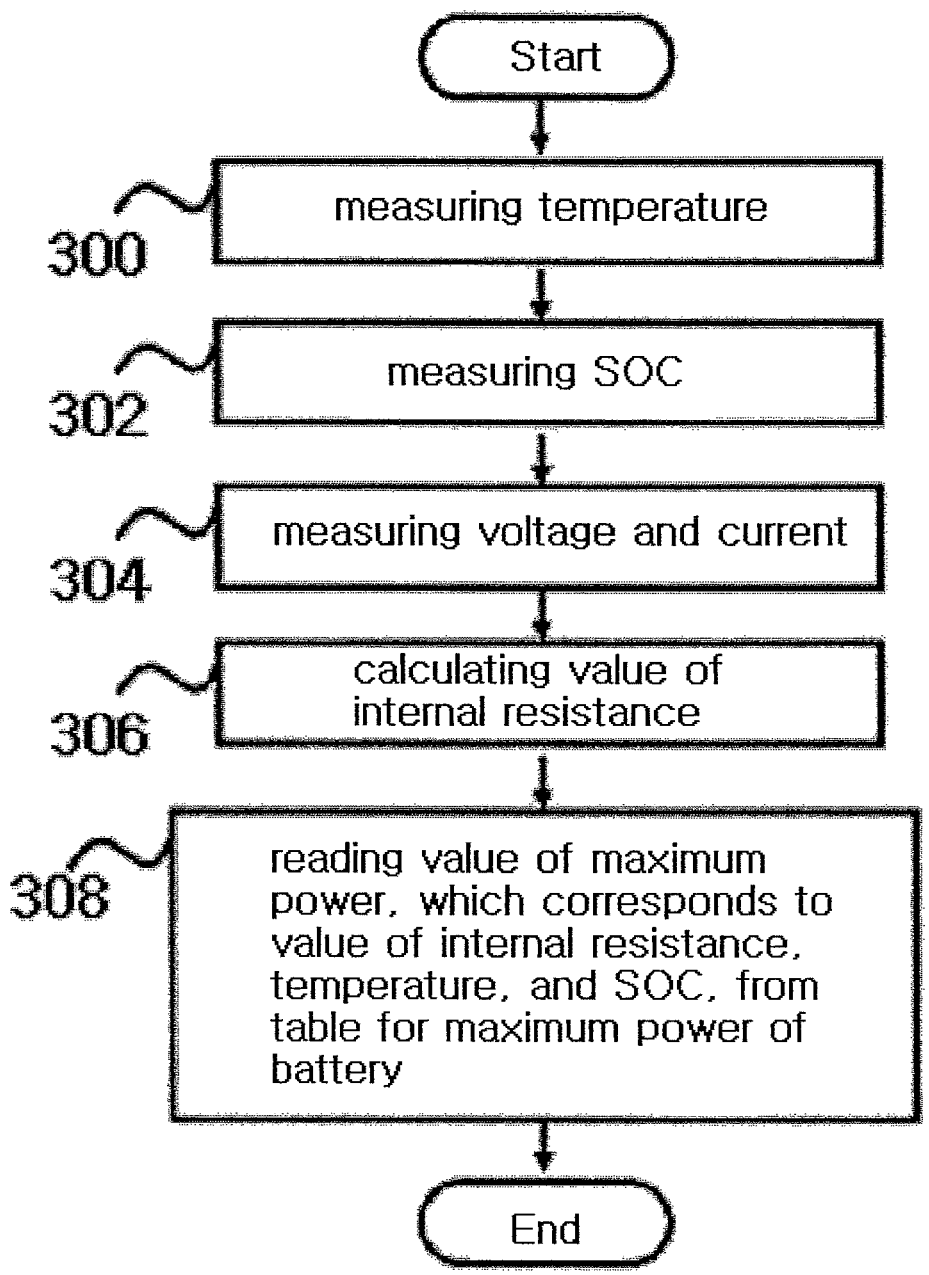
FIG. 4 is a flowchart illustrating a method for estimating the maximum power of the battery according to the preferred embodiment of the present invention.

Hereinafter, a method for estimating the maximum power of the battery according to the preferred embodiment of the present invention, which is applicable to the apparatus for estimating the maximum power of the battery, will be described with reference to the flowchart of FIG. 4.

When the estimation of the maximum power of the battery is requested, the controller 200 of the apparatus for estimating the maximum power of the battery measures the temperature through the temperature sensor 206, and estimates the state of charge of the corresponding battery through the unit 208 for estimating the state of charge (steps 300 and 302). Next, the controller 200 measures the voltage and the current of the corresponding battery through the unit 204 for measuring the current and the voltage, and calculates the value of the internal resistance in the corresponding battery based on the obtained voltage and current (step 306). Preferably, the real-time voltage and current is measured for one second while a vehicle provided with the battery is driven, and thereby the internal resistance is calculated by using the obtained current and voltage.

When the calculation of the internal resistance value is completed, the controller 200 reads the maximum power of the battery corresponding to the obtained temperature, estimated state of charge, and the calculated internal resistance value, from the table of the maximum power of the battery stored in a memory 202 (308). Thus, the estimation of the maximum power of the corresponding battery is completed.

INDUSTRIAL APPLICABILITY

According to the present invention, the table, which shows the correlation of the internal resistance values and the maximum powers of the battery according to the temperatures and states of charge through the experiment, is configured in advance. Then, the real-time internal resistance, the temperature, and the state of charge are measured, and the maximum power of the battery corresponding to the measurement result is read from the table, thereby easily and accurately estimating the maximum power of the battery without additional expense, which has too intensive a non-linearity and which cannot be directly estimated.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of estimating a maximum power of a battery, the method comprising:
    calculating, by a controller a first plurality of maximum powers of the battery experimentally according to a first temperature and a first plurality of internal resistances corresponding to a first plurality of states of charge of the battery, respectively, and a second plurality of maximum powers of the battery experimentally according to a second temperature and a second plurality of internal resistances corresponding to a second plurality of states of charge of the battery, respectively;
    storing, in a memory, a table having experimentally measured values, experimentally measured, representing the first plurality of maximum powers of the battery according to the first temperature and the first plurality of internal resistances corresponding to the first plurality of states of charge, respectively, and the second plurality of maximum powers according to the second temperature and the second plurality of internal resistances corresponding to the second plurality of states of charge, respectively;
    measuring, by a current and voltage measuring unit, a current and a voltage to calculate an internal resistance, measuring, by a temperature sensor, a temperature of the battery, and estimating, by a controller, a state of charge of the battery, as a result of an estimation of the maximum power of the battery being requested;
    transferring, from the memory to the controller, the first and second pluralities of stored maximum powers that are mapped according to the first and second stored temperatures, the first and second pluralities of stored internal resistances and the first and second pluralities of stored states of charge, respectively; and
    estimating, by the controller, values of the first and second pluralities of input maximum powers of the battery to operate a vehicle that is being driven and that includes the battery, the values of the first and second pluralities of input maximum powers of the battery corresponding to the measured temperature, the estimated state of charge, and the calculated internal resistance, from the table in which the first and second pluralities of stored maximum powers of the battery are mapped according to the first and second stored temperatures, the first and second pluralities of stored internal resistances and the first and second pluralities of stored states of charge, respectively,
    wherein a value of a measured voltage of battery terminals is not included among the values stored in the table.

2. The method as claimed in claim 1, wherein the first and second pluralities of internal resistances and the first and second pluralities of maximum powers of the battery taken in order to form the table, are actually carried out in a range of an operational temperature and an operational state of charge.

3. An apparatus for estimating a maximum power of a battery, the apparatus comprising:
    a controller configured to calculate a first plurality of maximum powers of the battery experimentally according to a first temperature and a first plurality of internal resistances corresponding to a first plurality of states of charge of the battery, respectively, and a second plurality of maximum powers of the battery experimentally according to a second temperature and a second plurality of internal resistances corresponding to a second plurality of states of charge of the battery, respectively;

a memory configured to store a table having experimentally measured values, experimentally measured, representing the first plurality of maximum powers of the battery according to the first temperature and the first plurality of internal resistances corresponding to the first plurality of states of charge, respectively, and the second plurality of maximum powers according to the second temperature and the second plurality of internal resistances corresponding to the second plurality of states of charge, respectively;

a current and voltage measuring unit configured to measure, as a result of an estimation of the maximum power of the battery being requested, a current and a voltage to calculate an internal resistance; and a temperature sensor configured to measure, as a result of the requested estimation, a temperature of the battery; and the controller configured to:

estimate, as a result of the requested estimation, a state of charge of the battery, transfer, from the memory to the controller, the first and second pluralities of stored maximum powers that are mapped according to the first and second stored temperatures, the first and second pluralities of stored internal resistances and the first and second pluralities of stored states of charge, respectively, and estimate values of the first and second pluralities of input maximum powers of the battery to operate a vehicle that is being driven and that includes the battery, the values of the first and second pluralities of input maximum powers of the battery corresponding to the measured temperature, the estimated state of charge, and the calculated internal resistance, from the table in which the first and second pluralities of stored maximum powers of the battery are mapped according to the first and second stored temperatures, the first and second pluralities of stored internal resistances and the first and second pluralities of stored states of charge, respectively, wherein a value of a measured voltage of battery terminals is not included among the values stored in the table.

* * * * *